(12) United States Patent
Ramdani et al.

(10) Patent No.: US 9,343,541 B2
(45) Date of Patent: *May 17, 2016

(54) METHOD OF FABRICATING GAN HIGH VOLTAGE HFET WITH PASSIVATION PLUS GATE DIELECTRIC MULTILAYER STRUCTURE

(71) Applicant: Power Integrations, Inc., San Jose, CA (US)

(72) Inventors: Jamal Ramdani, Raritan, NJ (US); Linlin Liu, Hillsborough, NJ (US); John Paul Edwards, Verona, NJ (US)

(73) Assignee: Power Integrations, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/154,355

(22) Filed: Jan. 14, 2014

(65) Prior Publication Data

US 2014/0124789 A1 May 8, 2014

Related U.S. Application Data

(63) Continuation of application No. 13/373,811, filed on Dec. 1, 2011, now Pat. No. 8,633,094.

(51) Int. Cl.
*H01L 29/778* (2006.01)
*H01L 29/66* (2006.01)
(Continued)

(52) U.S. Cl.
CPC ...... *H01L 29/66462* (2013.01); *H01L 21/0234* (2013.01); *H01L 21/02247* (2013.01);
(Continued)

(58) Field of Classification Search
CPC ............... H01L 21/02247; H01L 21/02249; H01L 21/02252; H01L 21/02274; H01L 21/02315; H01L 21/0234; H01L 29/2003; H01L 29/66431; H01L 29/66462; H01L 29/778; H01L 2924/13064
See application file for complete search history.

(56) References Cited

U.S. PATENT DOCUMENTS 4,142,195 A 2/1979 Carlson et al.
4,408,216 A 10/1983 Gould
(Continued)

FOREIGN PATENT DOCUMENTS

CN 1419713 5/2003
CN 101459080 6/2009
(Continued)

OTHER PUBLICATIONS

Van Hove et al. "CMOS Process-Compatible High-Power Low-Leakage AlGaN/GaN MISHEMT on Silicon," IEEE Electron Device Letters, Jan. 20, 2012, pp. 1-3, DOI 10.1109/LED.2012.2188016.
(Continued)

*Primary Examiner* — Eduardo A Rodela
*Assistant Examiner* — Christopher M Roland
(74) *Attorney, Agent, or Firm* — The Law Offices of Bradley J. Bereznak

(57) ABSTRACT

A method of fabricating a multi-layer structure for a power transistor device includes performing, within a reaction chamber, a nitrogen plasma strike, resulting in the formation of a nitride layer directly on a nitride-based active semiconductor layer. A top surface of the nitride layer is then exposed to a second source. A subsequent nitrogen-oxygen plasma strike results in the formation of an oxy-nitride layer directly on the nitride layer. The nitride layer comprises a passivation layer and the oxy-nitride layer comprises a gate dielectric of the power transistor device.

15 Claims, 3 Drawing Sheets

(51) Int. Cl.

| | | |
|---|---|---|
| *H01L 21/02* | (2006.01) | |
| *H01L 21/28* | (2006.01) | |
| *H01L 23/29* | (2006.01) | |
| *H01L 29/51* | (2006.01) | |
| *H01L 29/78* | (2006.01) | |
| *H01L 23/31* | (2006.01) | |
| *H01L 29/20* | (2006.01) | |
| *H01L 29/40* | (2006.01) | |
| *H01L 29/423* | (2006.01) | |

(52) U.S. Cl.

CPC .... *H01L21/02249* (2013.01); *H01L 21/02252* (2013.01); *H01L 21/02274* (2013.01); *H01L 21/02315* (2013.01); *H01L 21/28264* (2013.01); *H01L 23/291* (2013.01); *H01L 29/513* (2013.01); *H01L 29/66431* (2013.01); *H01L 29/778* (2013.01); *H01L 29/7786* (2013.01); *H01L 29/78* (2013.01); *H01L 23/3171* (2013.01); *H01L 29/2003* (2013.01); *H01L 29/402* (2013.01); *H01L 29/42376* (2013.01); *H01L 29/518* (2013.01); *H01L 2924/0002* (2013.01)

(56) References Cited

U.S. PATENT DOCUMENTS

| | | | |
|---|---|---|---|
| 6,078,090 | A | 6/2000 | Williams et al. |
| 6,515,308 | B1 | 2/2003 | Kneissl et al. |
| 6,518,079 | B2 | 2/2003 | Imler |
| 7,033,854 | B2 | 4/2006 | Morita |
| 7,041,579 | B2 | 5/2006 | Barsky et al. |
| 7,329,587 | B2 | 2/2008 | Bruedler et al. |
| 7,476,956 | B2 | 1/2009 | Parikh et al. |
| 8,399,911 | B2 | 3/2013 | Derluyn et al. |
| 8,592,866 | B2 | 11/2013 | Yanagihara et al. |
| 8,592,868 | B2 | 11/2013 | Heikman et al. |
| 8,629,525 | B2 | 1/2014 | Zhu et al. |
| 8,633,094 | B2 | 1/2014 | Ramdani et al. |
| 8,823,013 | B2 | 9/2014 | Zhu et al. |
| 8,916,929 | B2 | 12/2014 | Li et al. |
| 8,928,037 | B2 | 1/2015 | Ramdani et al. |
| 8,940,620 | B2 | 1/2015 | Koudymov et al. |
| 2002/0197835 | A1* | 12/2002 | Sun .................. G03F 7/091 438/585 |
| 2003/0020135 | A1 | 1/2003 | Kaminski et al. |
| 2005/0127754 | A1 | 6/2005 | Muth |
| 2005/0151255 | A1 | 7/2005 | Ando et al. |
| 2005/0179104 | A1 | 8/2005 | Shelton et al. |
| 2005/0179107 | A1 | 8/2005 | Pophristic et al. |
| 2005/0194610 | A1 | 9/2005 | Souma et al. |
| 2005/0202661 | A1 | 9/2005 | Ceruzzi et al. |
| 2005/0242365 | A1 | 11/2005 | Yoo |
| 2005/0277292 | A1* | 12/2005 | Peng ................. H01L 21/28562 438/672 |
| 2006/0051554 | A1* | 3/2006 | Kumakura ............. C30B 25/18 428/98 |
| 2006/0081948 | A1 | 4/2006 | Lim et al. |
| 2006/0145283 | A1 | 7/2006 | Zhu et al. |
| 2006/0197107 | A1 | 9/2006 | Kanamura et al. |
| 2006/0211159 | A1 | 9/2006 | Bruederl et al. |
| 2006/0220063 | A1 | 10/2006 | Kurachi et al. |
| 2006/0261356 | A1 | 11/2006 | Iwakami et al. |
| 2006/0261384 | A1 | 11/2006 | Rueb et al. |
| 2007/0114569 | A1 | 5/2007 | Wu et al. |
| 2007/0164321 | A1* | 7/2007 | Sheppard et al. ............. 257/256 |
| 2007/0207628 | A1* | 9/2007 | Chua .................. H01L 21/3144 438/769 |
| 2009/0026556 | A1 | 1/2009 | Otake |
| 2009/0058532 | A1 | 3/2009 | Kikkawa et al. |
| 2009/0173951 | A1* | 7/2009 | Kikkawa .......... H01L 21/02378 257/77 |
| 2009/0278233 | A1 | 11/2009 | Pinnington et al. |
| 2010/0012977 | A1 | 1/2010 | Derluyn et al. |
| 2010/0025730 | A1 | 2/2010 | Heikman et al. |
| 2010/0176421 | A1 | 7/2010 | Van Hove et al. |
| 2010/0327322 | A1 | 12/2010 | Kub et al. |
| 2010/0330754 | A1 | 12/2010 | Herbert |
| 2011/0101370 | A1 | 5/2011 | Cheng et al. |
| 2011/0101371 | A1 | 5/2011 | Zhu et al. |
| 2011/0121313 | A1 | 5/2011 | Briere |
| 2011/0156212 | A1 | 6/2011 | Arena |
| 2011/0272742 | A1 | 11/2011 | Akiyama et al. |
| 2011/0298016 | A1 | 12/2011 | Li et al. |
| 2012/0112263 | A1 | 5/2012 | Tanaka et al. |
| 2012/0153301 | A1 | 6/2012 | Shealy et al. |
| 2012/0156836 | A1 | 6/2012 | Shealy et al. |
| 2012/0156895 | A1 | 6/2012 | Shealy et al. |
| 2012/0238063 | A1 | 9/2012 | Murphy et al. |
| 2012/0319169 | A1 | 12/2012 | Van Hove |
| 2013/0157440 | A1 | 6/2013 | Ramdani et al. |
| 2014/0077266 | A1 | 3/2014 | Ramdani et al. |
| 2014/0124789 | A1 | 5/2014 | Ramdani et al. |
| 2014/0239309 | A1 | 8/2014 | Ramdani et al. |
| 2015/0076510 | A1 | 3/2015 | Ramdani et al. |

FOREIGN PATENT DOCUMENTS

| | | |
|---|---|---|
| CN | 100594591 | 3/2010 |
| CN | 101925995 | 12/2010 |
| CN | 102171830 | 8/2011 |
| CN | 102237405 | 11/2011 |
| FR | 2857982 | 1/2005 |
| JP | 2002064201 | 2/2002 |
| JP | 2003243323 | 8/2003 |
| JP | 2004087587 | 3/2004 |
| JP | 2009507396 | 2/2009 |
| JP | 2009302435 | 12/2009 |
| KR | 101004054 | 12/2010 |

OTHER PUBLICATIONS

Maeda et al. "DC and RF Characteristics in AL2O3/SI3N4 Insulated-Gate AlGaN/GaN Heterostructure Field-Effect Transistors," Japanese Journal of Applied Physics, vol. 44, No. 21, 2005, pp. L646-L648.

Maeda et al. "Design of Insulator/AlGaN Structures in MIS AlGaN/GaN HFETs for Higher Device Performance," Gallium Nitride Materials and Devices IV, Proc of SPIE vol. 7216 721605 1-12, 2009, DOI 10.1117/12.808816.

Domenica Visalli "Optimization of GaN-on-Si HEMTs for High Voltage Applications," Katholieke Universiteit Leuven, Celestijnenlaan 200d-bus 2417 3001 Leuven Belgie, Dec. 2011, pp. 4-5/80/82.

* cited by examiner

METHOD OF FABRICATING GAN HIGH VOLTAGE HFET WITH PASSIVATION PLUS GATE DIELECTRIC MULTILAYER STRUCTURE

This application is a continuation of application Ser. No. 13/373,811, filed Dec. 1, 2011, entitled, "GaN High Voltage HFET with Passivation Plus Gate Dielectric multilayer Structure", now U.S. Pat. No. 8,633,094, which is assigned to the assignee of the present application.

TECHNICAL FIELD

The present invention relates generally to Nitride III-based compound semiconductor devices and methods of fabrication thereof; more specifically, to Gallium Nitride (GaN) switching devices including GaN high electron mobility transistors (HEMTs) and GaN Hetero-junction Field Effect transistors (HFETs) and to methods of fabricating such power transistor devices.

BACKGROUND

Gallium nitride (GaN) and other wide band-gap nitride III based direct transitional semiconductor materials are advantageously utilized in certain electronic devices due to their superior physical prosperities over silicon-based devices. For example, GaN and AlGaN/GaN transistors are commonly used in high-speed switching and high-power applications due to the high electron mobility, high breakdown voltage, and high saturation electron velocity characteristics offered by GaN-based materials and device structures.

GaN and AlGaN/GaN integrated circuit (IC) devices are typically prepared by epitaxial growth of a semi-insulating (highly-resistive) GaN buffer layer on a substrate material such as Sapphire, Silicon Carbide, single crystal GaN, Si and so on. For high voltage operations, the IC device is required to have a high breakdown voltage VBR with minimal leakage current through the GaN buffer layer. One source of leakage current is the unintentionally doping (UID) by residual donors such as oxygen in the GaN buffer layer. For example, oxygen may be unintentionally introduced into the GaN buffer layer as a result of surface contamination during frontend and backend fabrication processing steps In addition, charge build-up (either positive or negative) may occur at the interfaces as a result of the piezoelectric nature of GaN and multiple dielectric depositions commonly performed during passivation. This charge build-up can adversely impact the voltage-current characteristics and frequency response of the IC device.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
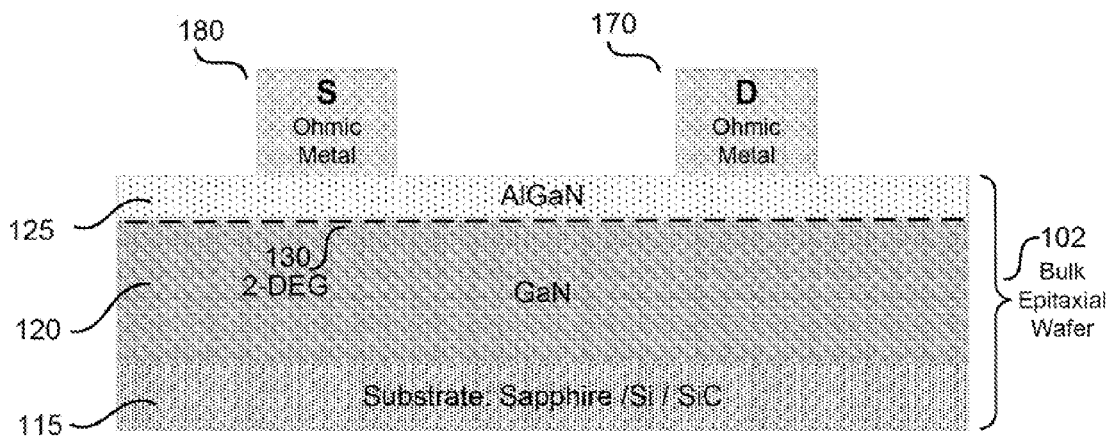
FIGS. 1A-1C are cross-sectional side views that illustrate an example GaN-based HFET device at various stages in a fabrication process, in accordance with embodiments of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As used herein, a wafer is a thin slice of semiconductor material, such as a silicon, sapphire, silicon carbide, gallium nitride, etc., crystal, used in the fabrication of integrated circuits.

In accordance with embodiments of the present invention, a GaN-based transistor device and method of fabricating the same is disclosed which includes an in situ processing step to form a passivation plus gate dielectric (e.g., oxide) multilayer for an HFET. A new material combination based on aluminum nitride (AlN) and aluminum oxy-nitride (AlON) is advantageously utilized in a fabrication process flow that mitigates charge build-up during passivation. At the same time, a high quality gate oxy-nitride layer is produced for use in a high power GaN-based HEMT. In one embodiment, an Atomic Layer Deposition (ALD) reaction chamber technique is utilized to form a high-quality, thin layer of nitride compound (e.g., AlN) over active transistor device layers, immediately followed by a gate oxide deposition comprising an oxy-nitride (e.g., AlON) material layer.

Figure 1B:
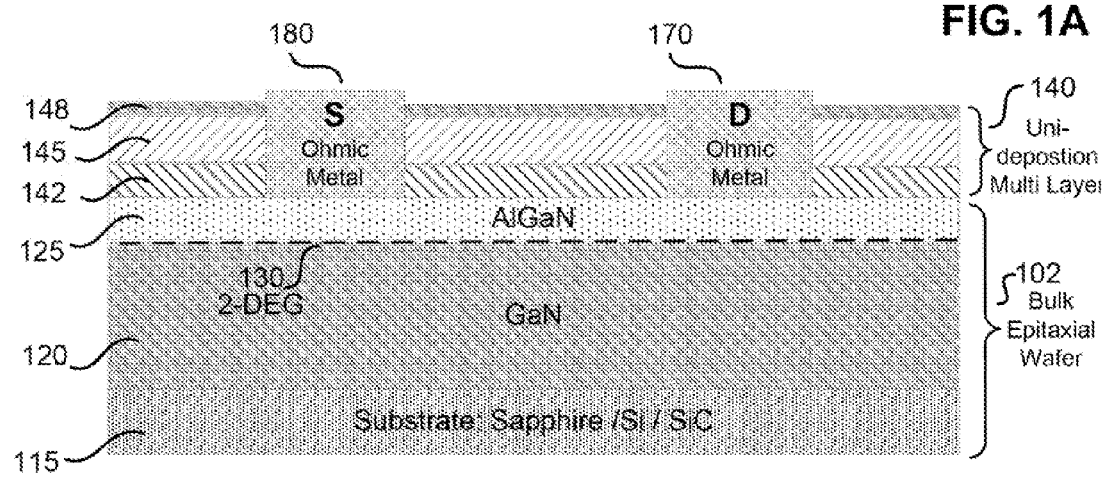
Figure 1C:
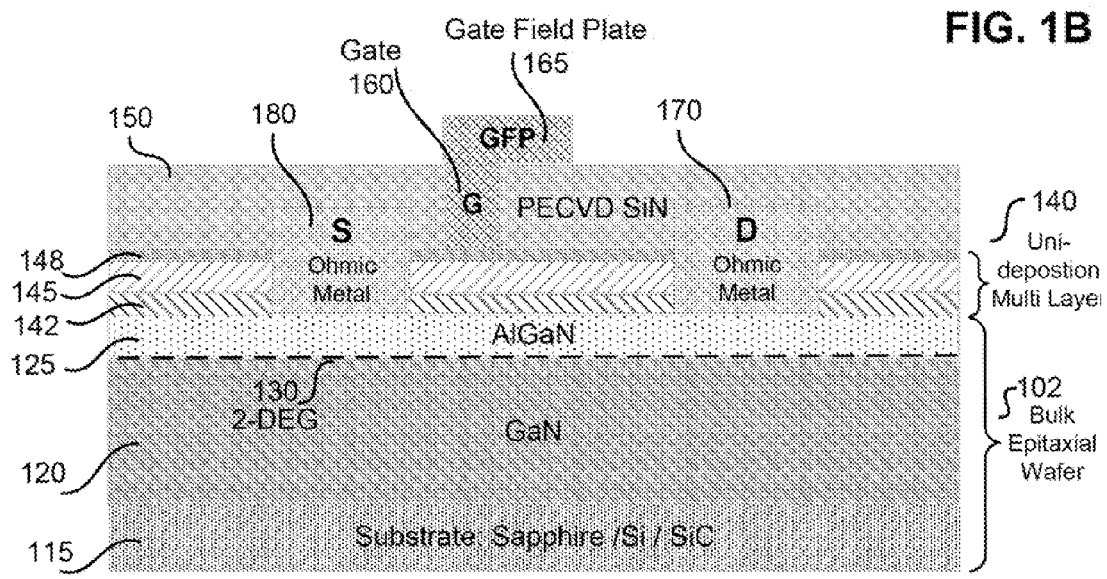

FIGS. 1A-1C illustrate cross-sectional side views of a semiconductor device structure (e.g., a GaN HFET device) at various stages in an example fabrication process. For example, FIG. 1A shows a bulk epitaxial wafer 102 which includes a substrate 115 formed of any one of a number of different materials, e.g., Sapphire, Si, GaN, or SiC. An epitaxial GaN buffer layer 120 is shown formed as the first active layer on substrate 115. To avoid possible problems with lattice mismatch and/or differences in thermal coefficients of expansion, an optional thin nucleation layer may be formed between substrate 115 and buffer layer 120 (see e.g., layer 215 in FIG. 2).

FIG. 1A further shows an Aluminum Gallium Nitride (AlGaN) layer 125 formed atop GaN buffer layer 120. AlGaN layer 125 comprises a second active layer of the GaN HFET device. A two dimensional electron gas channel (2-DEG) 130 is formed at the interface between AlGaN layer 125 and GaN buffer layer 120 due to the band-gap difference between the two material layers.

As shown, FIG. 1A also illustrates the device structure at a point in the fabrication process just after formation of ohmic metal contacts 180 and 170, which respectively comprise source and drain electrodes of the GaN HFET device. FIG. 1A shows ohmic metal contacts 180 and 170 formed directly on AlGaN layer 125. In other embodiments, ohmic metal contacts 180 and 170 may be formed in recesses that extend vertically downward through AlGaN layer 125 to contact GaN buffer layer 120.

FIG. 1B illustrates the example GaN HFET device structure of FIG. 1A after formation of a multi-layer structure 140 which comprises a passivation plus gate dielectric structure. In one embodiment, multi-layer structure 140 comprises an AlN passivation layer 142 disposed directly on AlGaN layer 125, and an AlON gate dielectric layer 145 disposed directly on AlN passivation layer 142. In other embodiments, passivation layer 142 may comprise SiN or other similar nitride-based materials. Gate dielectric layer 145 may also comprise silicon oxy-nitride (SiON) or another oxy-nitride material having similar properties.

FIG. 1B also shows an optional thin (e.g., 2-4 nm) second passivation layer 148 disposed directly on AlON layer 145. In the example shown, second passivation layer 148 comprises silicon nitride (SiN). It is appreciated that second passivation layer 148 may not be needed in certain embodiments. As shown, multilayer structure 140 functions both as a first or initial passivation layer to prevent surface oxidation/contamination of the underlying AlGaN (active) layer 125, and also a gate dielectric (insulator) for the completed GaN HFET device. In addition, AlN passivation layer 142 helps with the efficient modulation of charge, reduces leakage current, and increases the off-state voltage withstand of the completed GaN HFET device.

In one embodiment, multilayer structure 140 is formed in situ in an ALD reaction chamber with AlN layer 142 being formed with a thickness in a range of about 2-10 nm, and AlON layer 145 being formed with a thickness in a range of about 10-25 nm thick. In certain embodiments, AlON layer 145 may either be graded to allow for a smooth, gradual transition from the nitride to oxy-nitride layers (films). That is, the nitrogen composition in AlON layer 145 may vary from a highest atomic percentage (e.g., at or near 100%) at the interface with AlN layer 142 to a lowest percentage (e.g., a few atomic percent) at or near the top surface of AlON layer 145.

FIG. 1C illustrates the device structure of FIG. 1B after formation of a gate member 160, gate field plate 165, and Plasma Enhanced Chemical Vapor Deposition (PECVD) second passivation layer 150, the latter of which, in the example shown, comprises SiN. Persons of ordinary skill in the semiconductor arts will understand that FIG. 1C illustrates a completely fabricated GaN HFET device. It is further appreciated that other standard post-fabrication or back-end processing steps may be performed, including forming metal (e.g., patterned lines or traces) on the surface of the wafer, wafer backgrinding (also called backlapping or wafer thinning), die separation, and packaging.

Figure 2:
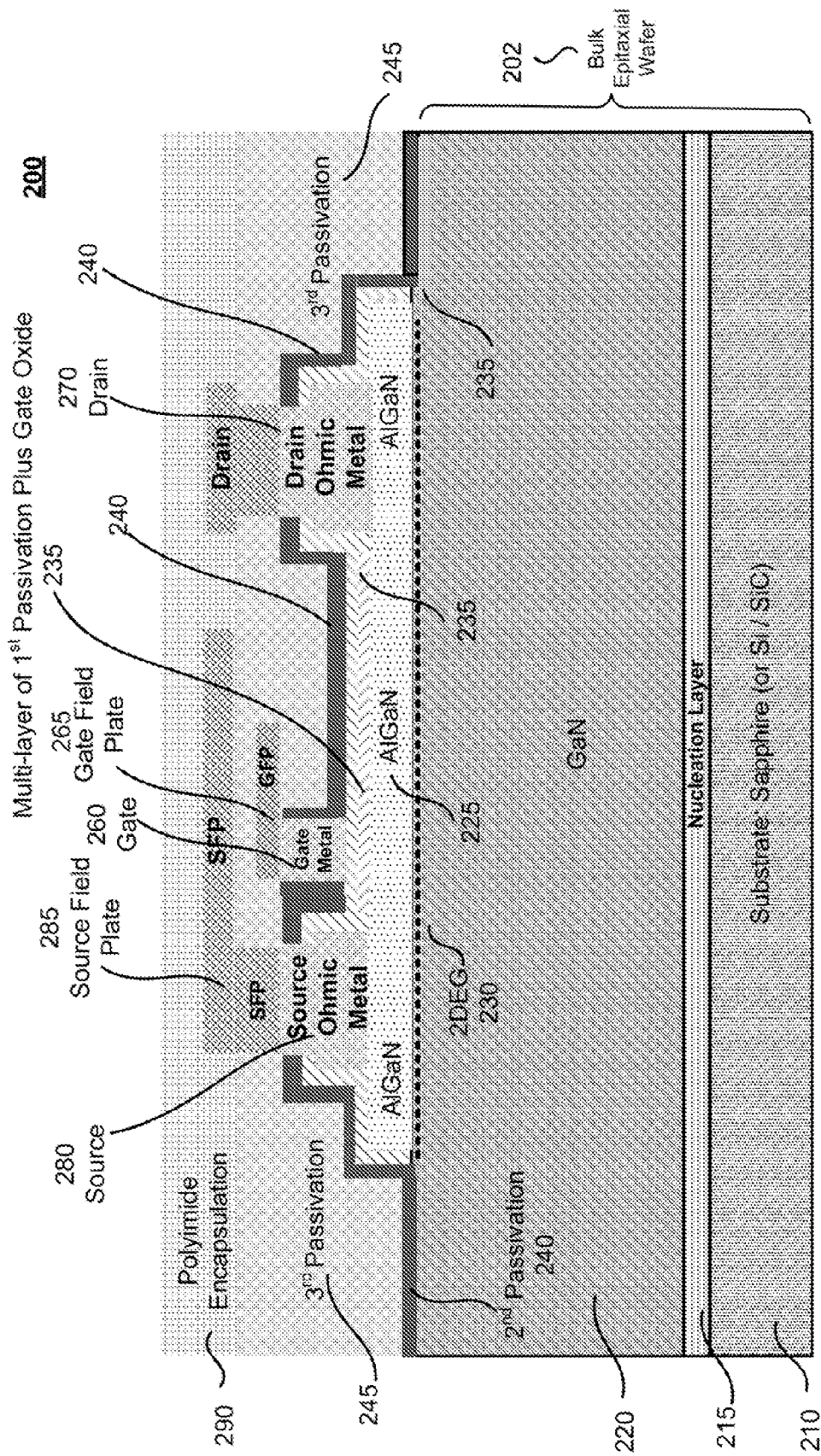
FIG. 2 is a cross-sectional side view of another example GaN HFET with embodiments of the present invention shown in FIGS. 1A-1C after completion of the fabrication process.

FIG. 2 is a cross-sectional side view of another completely fabricated GaN HFET device 200 that includes multilayer structure 235 comprising a combined first passivation and gate dielectric as described above. In the example shown, GaN HFET device 200 includes a nucleation (transitional) layer 215 disposed atop a substrate 210. Substrate 210 may comprise, without limitation, materials such as sapphire, silicon, gallium nitride, or silicon carbide (SiC). In one embodiment, nucleation layer 215 comprises an aluminum rich layer of AlGaN ($Al_xGa_{(x-1)}N$; $0>x>1$). Substrate 210, nucleation layer 215, and GaN buffer layer 220 collectively comprise bulk epitaxial wafer 202.

Continuing with the example device structure of GaN HFET 200, a GaN buffer layer 220 is disposed atop nucleation layer 215, and an AlGaN (or more generally, $Al_xGa_{(x-1)}N$; $0>x>1$) layer 225 is disposed atop GaN buffer layer 220. A two dimensional electron gas channel (2-DEG) 230 is formed at the interface between AlGaN layer 225 and GaN buffer layer 220. GaN HFET device 200 further includes a multi-layer (e. g., passivation plus gate dielectric) structure 235, second passivation layer 240, third passivation layer 245, and polyimide encapsulation layer 290. Source and drain ohmic metal contacts 280 and 270 are respectively formed directly on (or alternatively in recesses of) AlGaN layer 225. A gate member 260 is disposed atop of multi-layer structure 235. GaN HFET device 200 is also shown including a gate field plate 265 and a source field plate 285.

Figure 3:
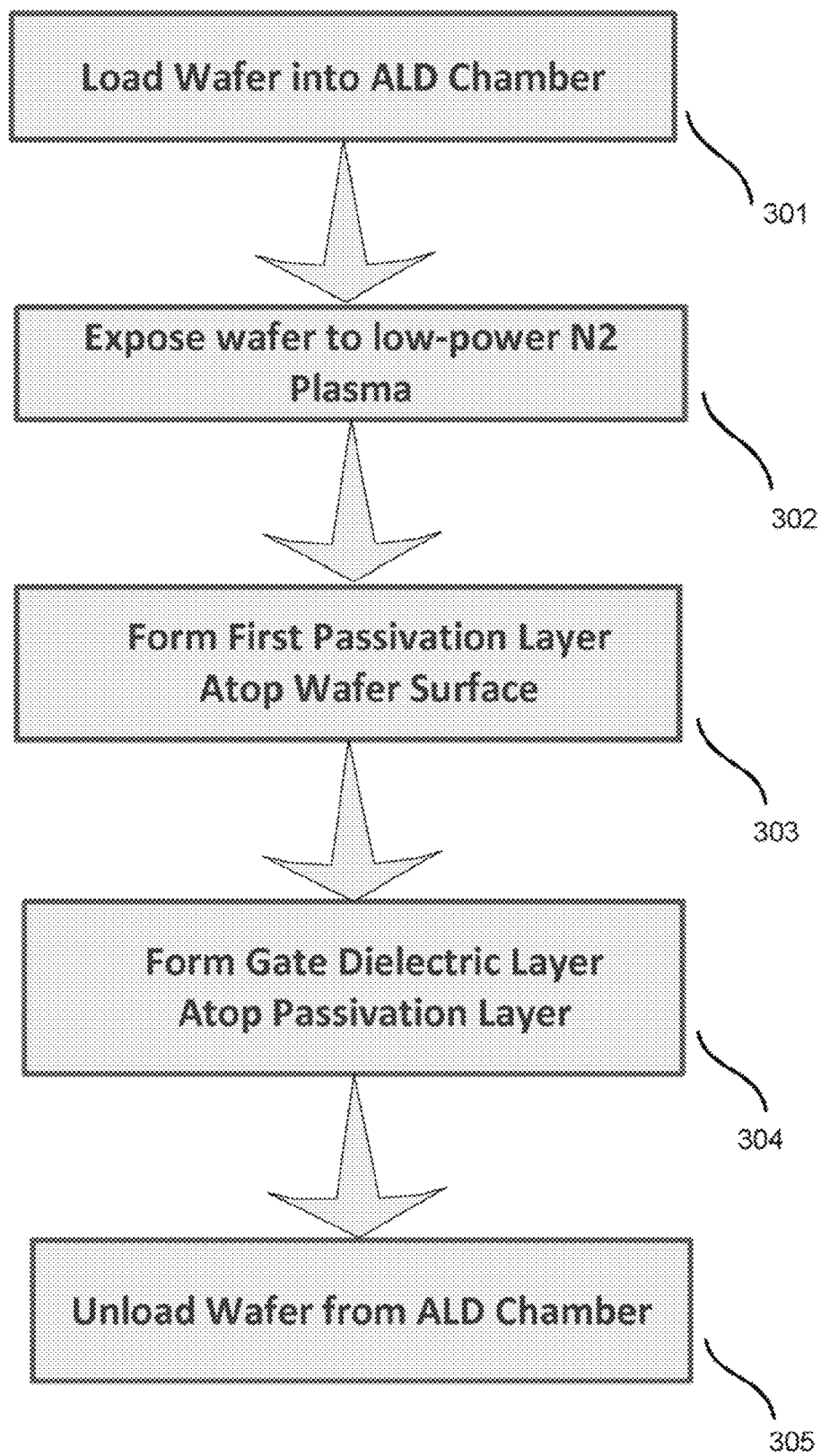
FIG. 3 is an example sequence of steps for formation of a passivation plus gate dielectric/insulation multilayer structure.

FIG. 3 is an example sequence of steps for formation of a first passivation plus gate dielectric multilayer structure. Following formation of ohmic metal contacts to the source and drain regions of the HFET, the multi-layer structure formation process begins with the immediate loading of the wafer into an ALD reaction chamber (block 301). Extended exposure to ambient atmosphere should be minimized to prevent oxidation of the top surface (i.e., active layer) of the wafer, which could result in the formation of an unwanted $Ga_2O_3$ layer. In one embodiment, after the wafer has been loaded into chamber, it remains under vacuum for about 3 minutes, with the temperature being stabilized at around 300 C.

Once loaded into the ALD reaction chamber, the top surface of the wafer (e.g., AlGaN layer 125 in FIG. 1) is exposed to a nitrogen ($N_2$) plasma strike, typically performed at low power (block 302). This plasma exposure acts as a cleaning step to prepare the surface of the wafer material for the subsequent ALD deposition steps.

Next, the first (e.g., AlN) passivation layer is formed in repetitive cycles of a sequence of steps (block 303). The typical time duration of each cycle may take anywhere from about 20 ms to about 20 seconds, which results in the formation of a layer (film) of between 0.1 Å-3.0 Å thick. In one embodiment, the sequence begins with exposure of the wafer to an aluminum source, e.g., tri-methyl aluminum (TMA), for about 30 milliseconds. This allows aluminum to react with the top surface (e.g., AlGaN) of the wafer. Following exposure to the aluminum source, the chamber and lines are purged of aluminum by an argon gas flush for approximately 2 seconds.

After the chamber and lines have been purged of aluminum, a nitrogen plasma strike is performed for about 15 seconds. This step provides a source of nitrogen to react with the aluminum previously deposited on the surface of wafer. In other words, a surface reaction occurs resulting in the formation of an AlN passivation layer. As previously discussed, in alternative embodiment, a SiN passivation layer may also be formed using silicon as a source rather than aluminum. Following the $N_2$ plasma strike, the chamber and lines are again purged (e.g., Argon gas for about 3 seconds), after which time the cycle may be repeated to achieve the desired material layer thickness. For the example GaN HFET device described above, the thickness of the AlN passivation layer is in an approximate range of 2-10 nm thick.

A second sequence of repetitive cycles is then performed to form a gate dielectric (e.g., oxide) layer atop the first AlN passivation layer (block 304). Note that the wafer is not removed from the ALD reaction chamber after any of the preceding steps. That is, the formation of the passivation plus gate dielectric multilayer structure is accomplished in situ, i.e., with the wafer in the ALD reaction chamber for the entirety of the processing steps required for formation of the multi-layer structure.

In one embodiment, the second sequence begins with exposure an aluminum source (TMA) with a specific dose which results in the reaction of aluminum on the AlN surface. The ALD reaction chamber and lines are then purged by an Argon gas flush for about 2 seconds. Next, a nitrogen-oxygen plasma strike is performed for about 15 seconds to provide a dual source of nitrogen and oxygen to react with the aluminum previously deposited on the surface of wafer. This step results in the formation of an atomic smooth layer of AlON atop the underlying AlN passivation layer. A second purge of the chamber and lines is performed again using Argon gas for about 3 seconds to flush out any excess of nitrogen and oxygen. The above sequence of steps may be repeated as necessary to produce the desired layer (film) thickness. in one embodiment, an AlON gate dielectric layer is formed to a thickness of about 10-25 nm.

Following formation of the AlON layer, an optional SiN layer (e.g., 2-4 nm thick) may be formed atop the AlON layer while the wafer remains in the ALD reaction chamber. The wafer is then removed from the ALD reaction chamber (block 305) and then subjected to the remaining processing steps necessary to completely fabricate the GaN HFET device. It is appreciated that the total processing time in the ALD reaction chamber is a function of the desired total thicknesses of the passivation and gate dielectric layers which form the multi-layer structure.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example thicknesses, material types, processing steps, etc., are provided for explanation purposes and that other values may also be employed in other embodiments and examples in accordance with the teachings of the present invention. These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

We claim:

1. A method of forming a passivation plus gate dielectric multilayer structure for a hetero-junction field-effect transistor (HFET) device comprising:
   (a) exposing, in a reaction chamber, a top surface of a nitride-based semiconductor wafer to a first source that forms a film of material on the top surface;
   (b) performing, within the reaction chamber, a first plasma strike that reacts with the film to form a nitride-based passivation layer on the top surface;
   (c) exposing, in the reaction chamber, the nitride-based semiconductor wafer to a second source that results in a reaction of a material on a surface of the nitride-based passivation layer;
   (d) performing, within the reaction chamber, a second plasma strike that reacts with the material to form an oxy-nitride layer directly on the nitride-based passivation layer, the nitride-based passivation layer and the oxy-nitride layer comprising a gate dielectric of the HFET device.

2. The method of claim 1 wherein the first source comprises aluminum (Al), the first plasma strike comprises nitrogen (N) and the nitride-based passivation layer comprises AlN.

3. The method of claim 1 wherein the first source comprises silicon (Si), the first plasma strike comprises nitrogen (N) and the nitride-based passivation layer comprises SiN.

4. The method of claim 1 wherein the first source comprises a tri-methyl aluminum (TMA) source.

5. The method of claim 1 further comprising repeating steps (a) and (b) until the nitride-based passivation layer is formed to a first thickness.

6. The method of claim 5 further comprising repeating steps (c) and (d) until the oxy-nitride layer is formed to a second thickness, the second thickness being greater than the first thickness.

7. The method of claim 6 wherein the second thickness is in a range of about 10-25 nm thick.

8. The method of claim 5 wherein the first thickness is in a range of about 2-10 nm thick.

9. The method of claim 1 further comprising, before step (a), loading the nitride-based semiconductor wafer into a reaction chamber, the nitride-based semiconductor wafer not being removed from the reaction chamber until completion of steps (a)-(d).

10. The method of claim 1 further comprises forming a silicon nitride layer atop the oxy-nitride layer; wherein the oxy-nitride layer is formed with a graded nitrogen composition that varies from a highest atomic percentage at or near the silicon nitride layer to a lowest atomic percentage at or near the oxy-nitride layer.

11. The method of claim 1 wherein the top surface of the nitride-based semiconductor wafer comprises an AlGaN layer.

12. The method of claim 11 wherein the AlGaN layer is formed atop a GaN layer, a two dimensional electron gas channel (2-DEG) being formed at an interface between the AlGaN layer and the GaN layer.

13. The method of claim 1 wherein the reaction chamber comprises an Atomic Layer Deposition (ALD) reaction chamber.

14. The method of claim 1 wherein the film of material comprises aluminum.

15. The method of claim 1 wherein the film of material comprises silicon.

* * * * *